(12) United States Patent
Akram et al.

(10) Patent No.: US 6,410,420 B2
(45) Date of Patent: *Jun. 25, 2002

(54) METHOD OF FABRICATING SILICIDE PATTERN STRUCTURES

(75) Inventors: Salman Akram; Y. Jeff Hu, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/795,882

(22) Filed: Feb. 28, 2001

Related U.S. Application Data

(63) Continuation of application No. 09/136,384, filed on Aug. 19, 1998, now Pat. No. 6,235,630.

(51) Int. Cl.$^7$ ........................................... H01L 21/4763
(52) U.S. Cl. ..................... 438/630; 438/299; 438/581; 438/583; 438/649; 438/651; 438/655; 438/664
(58) Field of Search ................................. 438/630, 625, 438/629, 636, 637, 648, 649, 650, 651, 655, 664, 663, 597, 952, 580, 581, 582, 583, 682, 683, 685, 686, 299, 300

(56) References Cited

U.S. PATENT DOCUMENTS

| | | | |
|---|---|---|---|
| 4,178,605 A | 12/1979 | Hsu et al. ........................ 357/42 |
| 4,305,200 A | 12/1981 | Fu et al. ........................ 29/571 |
| 4,374,700 A | 2/1983 | Scott et al. ................... 156/656 |
| 4,378,628 A | * 4/1983 | Levinstein et al. ........... 29/571 |
| 4,470,189 A | 9/1984 | Roberts et al. ................ 29/571 |
| 4,502,209 A | 3/1985 | Eizenberg et al. ............. 29/589 |
| 4,545,116 A | 10/1985 | Lau ............................... 29/591 |
| 4,570,328 A | 2/1986 | Price et al. .................... 29/571 |
| 4,593,454 A | 6/1986 | Baudrant et al. .............. 29/571 |
| 4,804,636 A | 2/1989 | Groover, III et al. ......... 437/52 |
| 5,064,683 A | 11/1991 | Poon et al. .................... 427/39 |
| 5,066,615 A | 11/1991 | Brady et al. ................. 437/229 |
| 5,268,590 A | 12/1993 | Pfiester et al. .............. 257/764 |
| 5,371,041 A | 12/1994 | Liou et al. .................. 437/192 |
| 5,384,285 A | 1/1995 | Sitaram et al. ............. 437/200 |
| 5,444,018 A | 8/1995 | Yost et al. .................. 437/190 |
| 5,510,292 A | 4/1996 | Hayashi ...................... 437/187 |
| 5,536,684 A | 7/1996 | Dass et al. .................. 437/201 |
| 5,567,651 A | 10/1996 | Berti et al. ................. 437/200 |
| 5,612,250 A | 3/1997 | Ohtani et al. ............... 437/101 |
| 5,665,641 A | 9/1997 | Shen et al. .................. 438/643 |
| 5,691,212 A | 11/1997 | Tsai et al. ..................... 437/24 |
| 5,691,225 A | 11/1997 | Abiko ........................... 437/57 |
| 5,696,017 A | 12/1997 | Ueno ............................ 437/60 |
| 5,718,800 A | 2/1998 | Juengling ................. 156/643.1 |
| 5,847,463 A | 12/1998 | Trivedi et al. .............. 257/751 |
| 6,107,190 A | * 8/2000 | Taguwa et al. ............. 438/637 |

FOREIGN PATENT DOCUMENTS

JP        4307934        * 10/1992

* cited by examiner

Primary Examiner—Tuan H. Nguyen
Assistant Examiner—Thanhha Pham
(74) Attorney, Agent, or Firm—TraskBritt

(57) ABSTRACT

Silicide interfaces for integrated circuits, thin film devices, and backend integrated circuit testing devices are formed using a barrier layer, such as titanium nitride, disposed over a porous, thin dielectric layer which is disposed between a silicon-containing substrate and a silicidable material which is deposited to form the silicide interfaces for such devices. The barrier layer prevents the formation of a silicide material within imperfections or voids which form passages through the thin dielectric layer when the device is subjected to a high temperature anneal to form the silicide contact from the reaction of the silicidable material and the silicon-containing substrate.

16 Claims, 12 Drawing Sheets

METHOD OF FABRICATING SILICIDE PATTERN STRUCTURES

CROSS-REFERENCE TO RELATED APPLICATIONS

This application is a continuation of application Ser. No. 09/136,384, filed Aug. 19, 1998, now U.S. Pat. No. 6,235,630.

BACKGROUND OF THE INVENTION

1. Field of the Invention

The present invention relates to contact interfaces on the surface of semiconductor substrates and methods of forming the same. More particularly, the present invention relates to forming silicide interfaces for use with thin film devices and backend integrated circuit ("IC") testing devices.

2. State of the Art

In the processing of integrated circuits, electrical contact must be made to isolated active-device regions formed within a semiconductor substrate, such as a silicon wafer. Such active-device regions may include p-type and n-type source and drain regions used in the production of NMOS, PMOS, and CMOS structures for production of DRAM chips and the like. The active-device regions are connected by conductive paths or lines which are fabricated above an insulative or dielectric material covering a surface of the semiconductor substrate. To provide electrical connection between the conductive path and the active-device regions, openings in the insulative material are generally provided to enable a conductive material to contact the desired regions, thereby forming a "contact." The openings in the insulative material are typically referred to as "contact openings."

Higher performance, lower cost, increased miniaturization of components, and greater packaging density of integrated circuits are goals of the computer industry. However, as components become smaller and smaller, tolerances for all semiconductor structures (such as circuitry traces, contacts, dielectric thickness, and the like) become more and more stringent. In fact, each new generation of semiconductor device technology has seen a reduction in contact size of, on average, about 0.7 times. Further, the reduction in size of integrated circuits also results in a reduction in the height of the integrated circuits.

Of course, the reduction in contact size (i.e., diameter) has resulted in a greatly reduced area of contact between the active-device regions and the conductive material. Regardless of the conductive material used to fill these small contact openings to form the contacts (such as tungsten or aluminum), the interface between the conductive material and active-device region must have a low resistance.

Various methods have been employed to reduce the contact resistance at the interface between the conductive material and active-device region. One such method includes the formation of a metal silicide contact interface atop the active-device region within the contact opening prior to the application of the conductive material into the contact opening. A common metal silicide material formed is cobalt silicide ($CoSi_x$, wherein x is predominately equal to 2) generated from a deposited layer of cobalt. Cobalt silicide is preferred for shallow junctions of thin film structures because it forms very smooth, fine grained silicide, and will not form tightly bonded compounds with arsenic or boron atoms used in the doping of shallow junctions.

FIGS. 27-31 illustrate a common method of forming a cobalt silicide layer on an active-device region of a thin film semiconductor device. FIG. 27 illustrates an intermediate structure 400 comprising a semiconductor substrate 402 with a polysilicon layer 404 thereon, wherein the polysilicon layer 404 has at least one active-device region 406 formed therein with a thin dielectric layer 408, such as tetraethyl orthosilicate—TEOS, disposed thereover. The dielectric layer 408 must be as thin as possible to reduce the height of the thin film semiconductor device. A contact opening 412 is formed, by any known technique, such as patterning and etching, in the dielectric layer 408 to expose a portion of the active-device region 406, as shown in FIG. 28. A thin layer of cobalt 414 is applied over the dielectric layer 408 and the exposed portion of the active-device region 406, as shown in FIG. 29. A high temperature anneal step is conducted in an inert atmosphere to react the thin cobalt layer 414 with the active-device region 406 in contact therewith which forms a cobalt silicide layer 416, as shown in FIG. 30. However, dielectric materials, such as TEOS—tetraethyl orthosilicate, BPSG—borophosphosilicate glass, PSG—phosphosilicate glass, and BSG—borosilicate glass, and the like, are generally porous. Thus, the thin dielectric layer 408 has imperfections or voids which form passages through the thin dielectric layer 408. Therefore, when the high temperature anneal is conducted, cobalt silicide also forms in these passages. The cobalt silicide structures in the passages are referred to as patches 418, as also shown in FIG. 30. When the non-reacted cobalt layer 414 is removed to result in a final structure 422 with a cobalt silicide layer 416 formed therein, as shown in FIG. 31, the patches 418 also form conductive paths between the upper surface of the thin dielectric layer 408 which can cause shorting and current leakage on IC backend testing devices which leads to poor repeatability and, thus, poor reliability of the data from the testing devices.

Although such voids can be eliminated by forming a thicker dielectric layer 424, the thicker dielectric layer 424 leads to poor step coverage of the cobalt material 426 in bottom corners 428 of the contact opening 412, as shown in FIG. 32. The poor step coverage is cause by a build-up of cobalt material 426 on the upper edges 432 of the contact opening 412 which causes shadowing of bottom corners 428 of the contact openings 412. The result is little or no cobalt material 426 deposited at the bottom corners 428 of the contact opening 412 and consequently an inefficient silicide contact formed after annealing.

Step coverage can be improved by using filtering techniques, such as physical collimated deposition and low-pressure long throw techniques, which are used to increase the number of sputtered particles contacting the bottom of the contact opening. However, such filtering techniques are costly and the equipment is difficult to clean. Furthermore, filtering techniques also reduce the deposition rate of the cobalt material which reduces product throughput and, in turn, increases the cost of the semiconductor device. Moreover, using a thick dielectric layer is counter to the goal of reducing semiconductor device size. Finally, a thick dielectric layer eliminates the ability of the structure to be used as a backend IC probing device since the contacts are too small and too deep in the dielectric material. This is a result of dielectric material not being scalable. As device geometries get smaller, the thickness of the dielectric cannot be reduced without the potential of shorting and/or formation of patches. Thus, contact size must be increased to allow probe tips to fit in contacts, which is counter to the goal of reducing semiconductor device size.

Thus, it can be appreciated that it would be advantageous to develop a technique and a contact interface which is free from patch formations, while using inexpensive, commercially-available, widely-practiced semiconductor device fabrication techniques and equipment without requiring complex processing steps

BRIEF SUMMARY OF THE INVENTION

The present invention relates to methods of forming silicide interfaces for use with thin film devices and backend integrated circuit testing devices and structures so formed. The present invention is particularly useful when a porous dielectric layer is disposed between a silicon-containing substrate and a silicidable material deposited to form a silicide contact in a desired area. As previously discussed, dielectric layers may have imperfections or voids which form passages through the thin dielectric layer. Therefore, when the high temperature anneal is conducted to form the silicide contact from the reaction of the silicidable material and the silicon-containing substrate, a silicide material may also form in these passages through the dielectric material. Such silicide material extending through these passages can cause shorting and current leakage. The present invention prevents the formation of silicide material through passages in the dielectric material by the application of a barrier layer between the dielectric material and the silicidable material.

In an exemplary method of forming a contact according to the present invention, a semiconductor substrate is provided with a polysilicon layer disposed thereon, wherein at least one active-device region is formed in a polysilicon layer. A thin dielectric layer is deposited or grown (such as by a thermal oxidation process) over the polysilicon layer and a layer of barrier material, preferably titanium nitride, is deposited over the thin dielectric layer.

A mask material is patterned on the barrier material layer and a contact opening is then etched through the barrier material layer and the thin dielectric layer, preferably by an anisotropic etch, to expose a portion of the active-device region. Any remaining mask material is removed and a thin layer of silicidable material, such as cobalt, titanium, platinum, or palladium, is deposited over the barrier material layer and into the contact opening over the exposed portion of the active-device region. A high temperature anneal is conducted to react the thin silicidable material layer with the active-device region in contact therewith, which forms a silicide contact. The barrier material prevents the formation of silicide structures within voids and imperfections in the thin dielectric layer. The non-reacted silicidable material layer and remaining barrier material layer are then removed.

In an exemplary method of forming a testing contact used in backend testing of semiconductor devices, a silicon-containing substrate is provided having at least one contact projection disposed thereon. A first dielectric layer is deposited or grown over the substrate and the contact projection. A layer of polysilicon is then deposited over the first dielectric layer. A second dielectric layer is optionally deposited over the polysilicon layer and a layer of barrier material is deposited over the optional second dielectric layer, or over the polysilicon, if the optional second dielectric layer is not used.

A mask material is patterned on the barrier material layer. The barrier material layer and the optional second dielectric layer (if used) are then etched to expose the polysilicon layer over the contact projection, then any remaining mask material is removed. A thin layer of silicidable material is deposited over the barrier material layer and onto the exposed contact projection. A high temperature anneal is conducted to react the thin silicidable material layer with the exposed portion of the polysilicon layer over the contact projection which forms a silicide layer. The non-reacted silicidable material layer and the remaining barrier material layer are then removed to form the testing contact.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

FIGS. 1–8 illustrate a method of forming a contact interface of the present invention. It should be understood that the illustrations are not meant to be actual views of any particular semiconductor device, but are merely idealized representations which are employed to more clearly and fully depict the formation of contact interfaces in the present invention than would otherwise be possible. Additionally, elements common between FIGS. 1–8 retain the same numerical designation.

Although the examples presented are directed to the formation of cobalt silicide contact interfaces, any metal or metal alloy which is capable of forming a silicide may be employed, including, but not limited to, titanium, platinum, or palladium.

Figure 1:
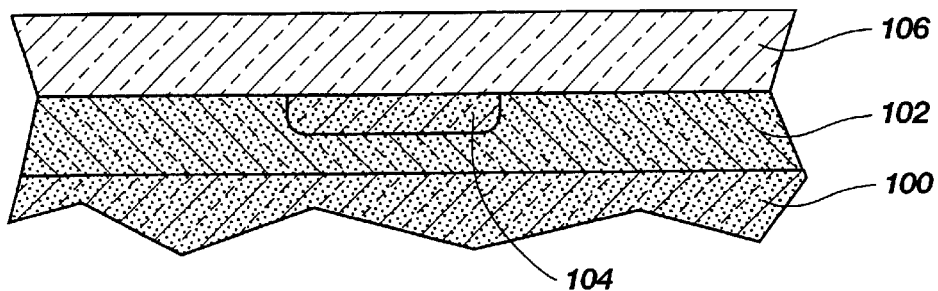
FIGS. 1–8 are cross-sectional views of a method of forming a contact interface in a thin semiconductor structure according to the present invention.
Figure 2:
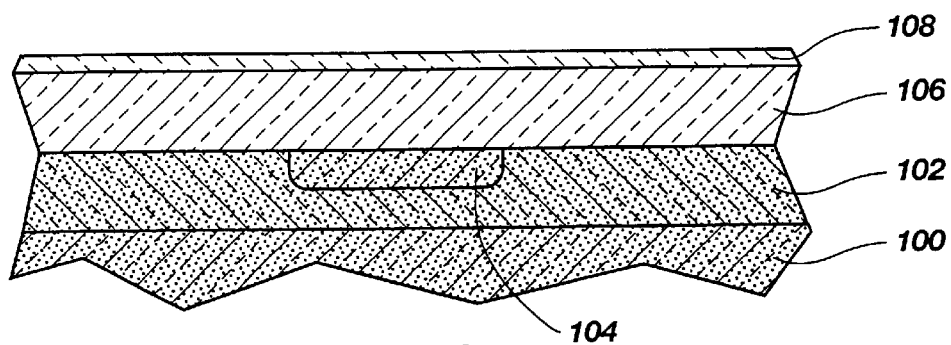

FIG. 1 illustrates a semiconductor substrate 100, such as a silicon-containing substrate, having a polysilicon layer 102 thereon, wherein at least one active-device region 104 is formed in a polysilicon layer 102, with a thin dielectric layer 106, such as TEOS, of a thickness of approximately 1 kÅ disposed over the polysilicon layer 102. A layer of barrier material 108, preferably titanium nitride deposited to a thickness of between about 100–150 Å, is deposited over the thin dielectric layer 106, such as by PVD, as shown in FIG. 2. Other potential barrier materials include tungsten nitride, tungsten silicon nitride, titanium silicon nitride, and the like.

Figure 3:
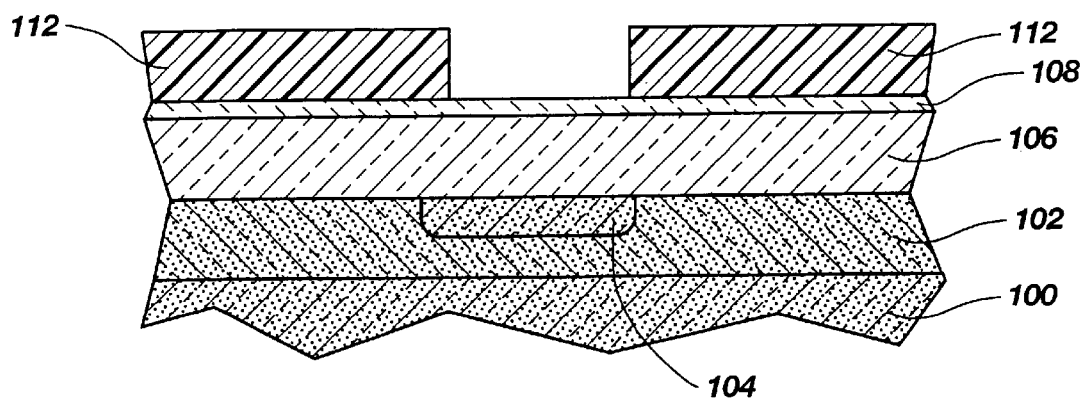
Figure 4:
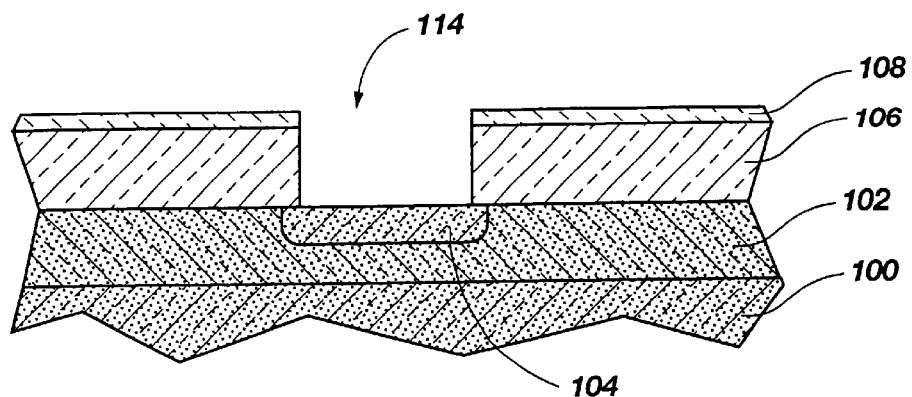
Figure 5:
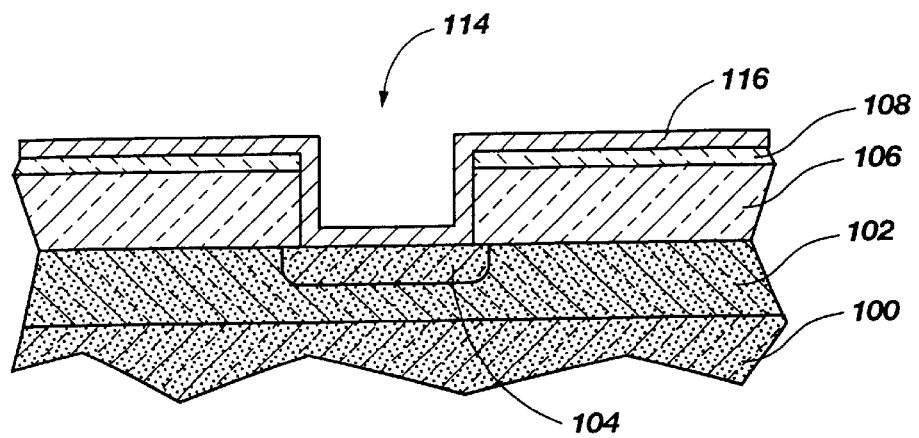
Figure 6:
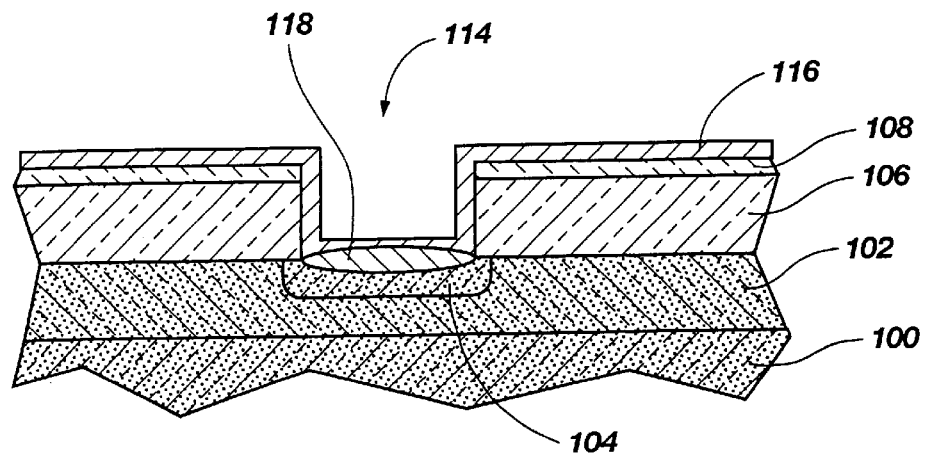

A mask material 112 is patterned on the barrier material layer 108, as shown in FIG. 3. A contact opening 114 is then etched through the barrier material layer 108 and the thin dielectric layer 106, preferably by a dry etch such as reactive ion etching or the like, to expose a portion of the active-device region 104, then any remaining mask material 112 is removed, as illustrated in FIG. 4. A thin layer of cobalt 116 is deposited, preferably by PVD, over the barrier material layer 108 and into the contact opening 114 over the exposed portion of the active-device region 104, as shown in FIG. 5. A high temperature anneal step, preferably between about 400 and 800° C., most preferably between about 450 and 600° C. for between about 5 seconds and 1 hour, is conducted in an inert atmosphere, preferably nitrogen containing gas, to react the thin cobalt layer 116 with the active-device region 104 in contact therewith which forms a cobalt silicide layer 118, as shown in FIG. 6. The barrier material layer 108 prevents the formation of cobalt silicide structures within voids and imperfections in the thin dielectric layer 106. In particular, it has been found that a thin titanium nitride film acts as a good diffusion barrier for a thin TEOS dielectric layer. Further, it has been found that titanium nitride does not react with cobalt. Thus, cobalt silicide patch formations have been eliminated when titanium nitride is used as a barrier layer over a thin TEOS dielectric layer.

Figure 7:
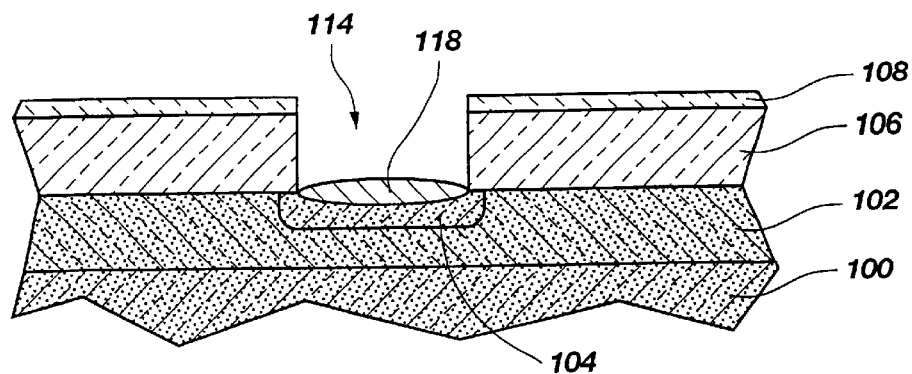

The non-reacted cobalt layer 116 is removed, preferably by a wet etch such as hydrochloric acid/peroxide or sulfuric acid/peroxide mixtures, wherein the barrier material layer 108 preferably acts as an etch stop, as shown in FIG. 7. Preferably, the non-reacted cobalt layer 116 is etched in a dilute HPM (Hydrochloric acid/Peroxide Mixture) solution (typically, 1 volume of hydrochloric acid to 1 volume of peroxide to 5 volumes of water) for about 30 seconds at about 30° C. Such an HPM solution is preferred because its selectivity is greater than $10^4$ for cobalt against cobalt silicide and titanium nitride.

Figure 8:
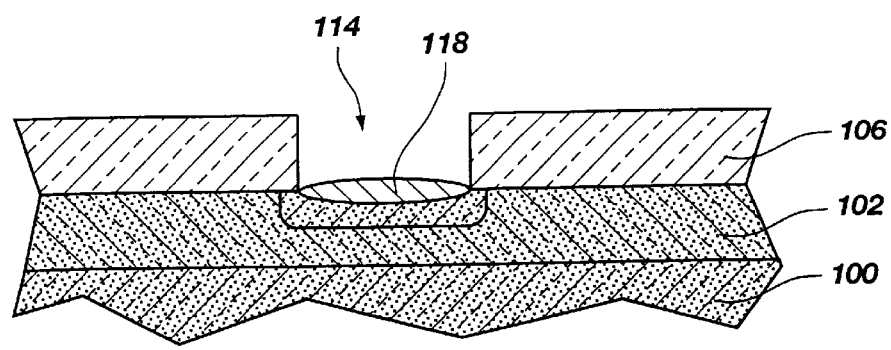

As shown in FIG. 8, the remaining barrier material layer 108 is then removed, preferably by etching in an APM solution (Ammonia/Peroxide Mixture) solution (typically, 1 volume of ammonia to 1 volume of peroxide to 5 volumes of water) for between about 1 and 2 minutes at about 65° C. Such an APM solution is preferred because of its selectivity for titanium nitride against cobalt silicide and TEOS.

Figure 9:
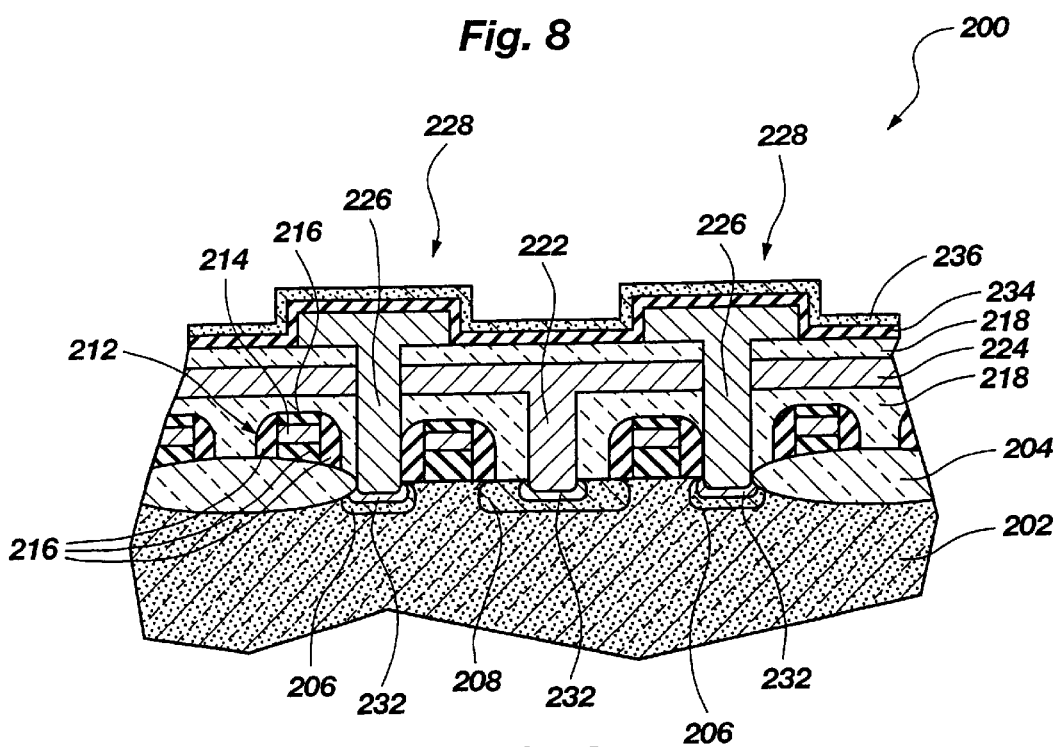
FIG. 9 is a cross-sectional view of CMOS structures within a memory array of a DRAM chip formed by a method according to the present invention.

It is contemplated that the process of the present invention may be utilized for production of DRAM chips, wherein the contact interfaces are used in the MOS structures within a memory array of a DRAM chip. Such a MOS structure 200 is illustrated in FIG. 9 as a portion of a memory array in a DRAM chip. The MOS structure 200 comprises a semiconductor substrate 202, such as a lightly doped P-type crystal silicon substrate, which has been oxidized to form thick field oxide areas 204 and exposed to implantation processes to form drain regions 206 and source regions 208. Transistor gate members 212, including a wordline 214 bounded by insulative material 216, are formed on the surface of the semiconductor substrate 202 and thick field oxide areas 204. A barrier layer 218 is disposed over the semiconductor substrate 202, the thick field oxide areas 204, and the transistor gate members 212. The barrier layer 218 has bitline contacts 222 contacting the source regions 208 for electrical communication with a bitline 224 and, further, has capacitor contacts 226 contacting the drain regions 206 for electrical communication with memory cell capacitors 228. Each of the bitline contacts 222 and capacitor contacts 226 may have silicide layer interfaces 232, formed as described above, for reducing resistance between the bitline contacts 222 and the source regions 208, and between the capacitor contacts 226 and the drain regions 206. The memory cell capacitors 228 are completed by depositing a dielectric material layer 234, then depositing a cell poly layer 236 over the dielectric material layer 234.

FIGS. 10–17 illustrate a method of forming a testing contact used in backend testing of semiconductor devices. It should be understood that the illustrations are not meant to be actual views of any particular semiconductor device, but are merely idealized representations which are employed to more clearly and fully depict the formation of contact interfaces in the present invention than would otherwise be possible. Additionally, elements common between FIGS. 10–17 retain the same numerical designation.

Figure 10:
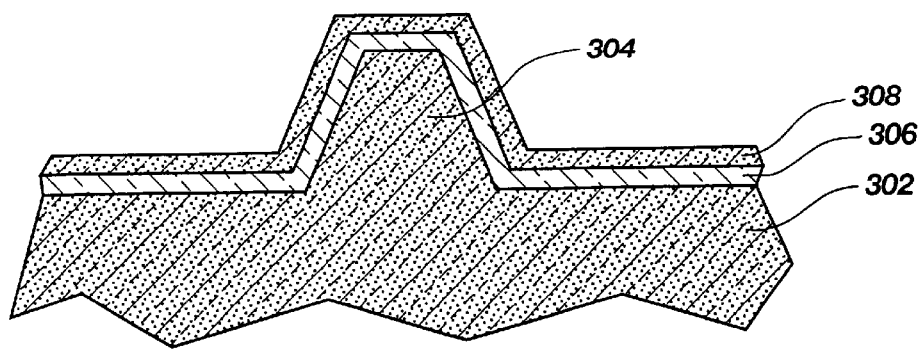
FIGS. 10–17 are cross-sectional views of a method of forming a testing interface according to the present invention.
Figure 11:
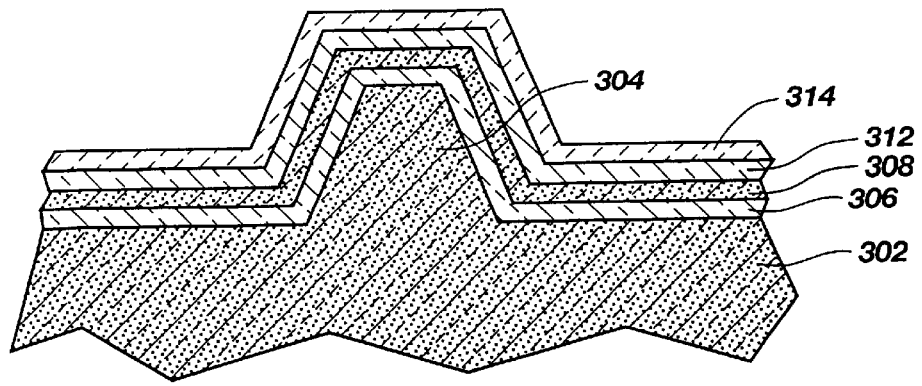

FIG. 10 illustrates a substrate 302 having at least one contact projection 304 disposed thereon, preferably with a height of approximately 100 $\mu$m, wherein the substrate 302 and the contact projection 304 have a first dielectric layer 306, preferably silicon dioxide, disposed thereover. The first dielectric layer 306 may be deposited by any known technique or, if silicon dioxide, may be grown on the surface of the substrate 302 by a thermal oxidation process. A layer of polysilicon 308 is deposited by any known technique over the first dielectric layer 306. As shown in FIG. 11, a second dielectric layer 312, such as TEOS or silicon dioxide, is deposited over the polysilicon layer 308 and a layer of barrier material 314, preferably titanium nitride, is deposited over the second dielectric layer 312, such as by PVD.

Figure 12:
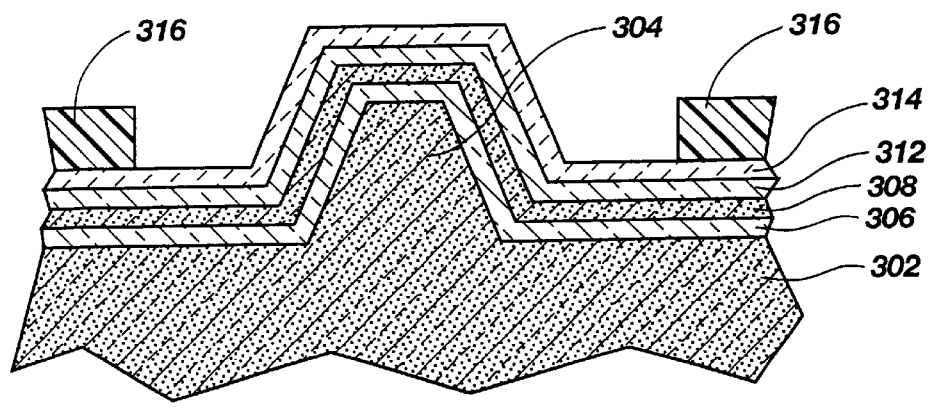
Figure 13:
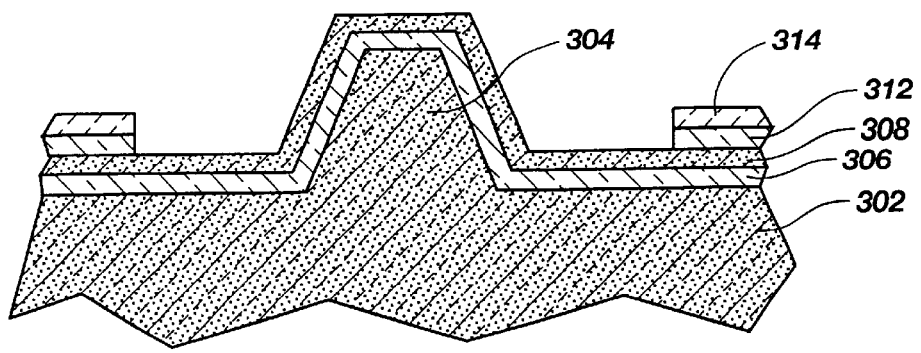
Figure 14:
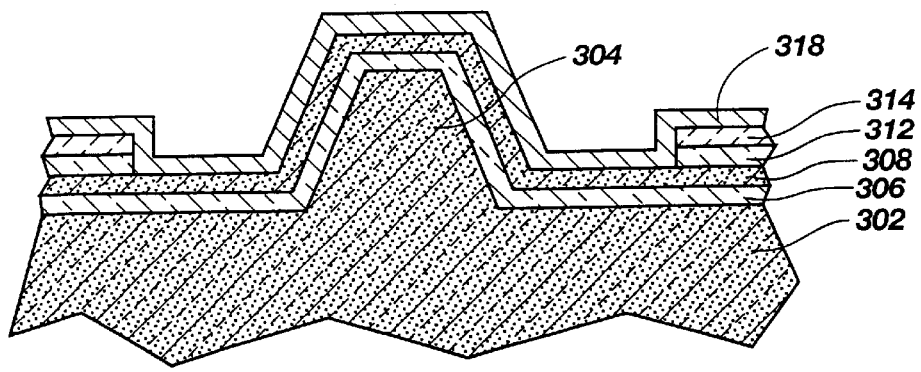
Figure 15:
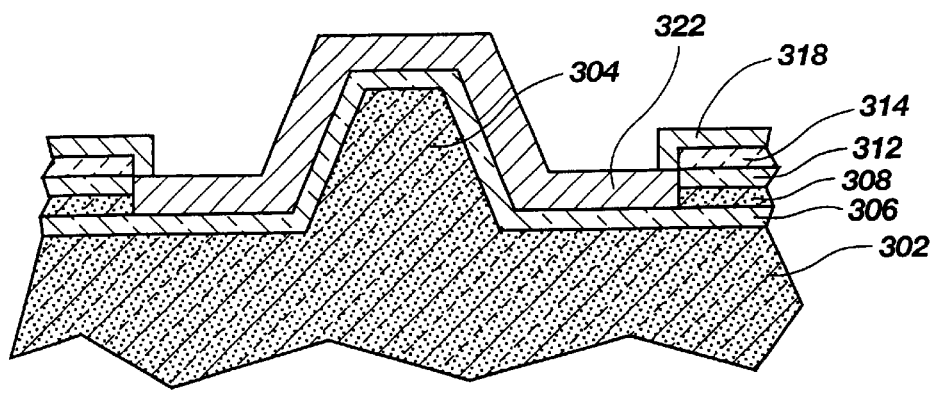

A mask material 316 is patterned on the barrier material layer 314, as shown in FIG. 12. The barrier material layer 314 and the second dielectric layer 312 are then etched, preferably by a dry etch such as reactive ion etching or plasma etching, to expose the polysilicon layer 308 over the contact projection 304, then any remaining mask material 316 is removed, as illustrated in FIG. 13. A thin layer of cobalt 318 is deposited, preferably by PVD, over the barrier material layer 314 and onto the exposed contact projection 304, as shown in FIG. 14. A high temperature anneal step, preferably between about 400 and 800° C., most preferably between about 450 and 600° C. for between about 5 seconds and 1 hour, is conducted in an inert atmosphere, preferably nitrogen containing gas, to react the thin cobalt layer 318 with the exposed portion of the polysilicon layer 308 over the contact projection 304 which forms a cobalt silicide layer 322, as shown in FIG. 15.

Figure 16:
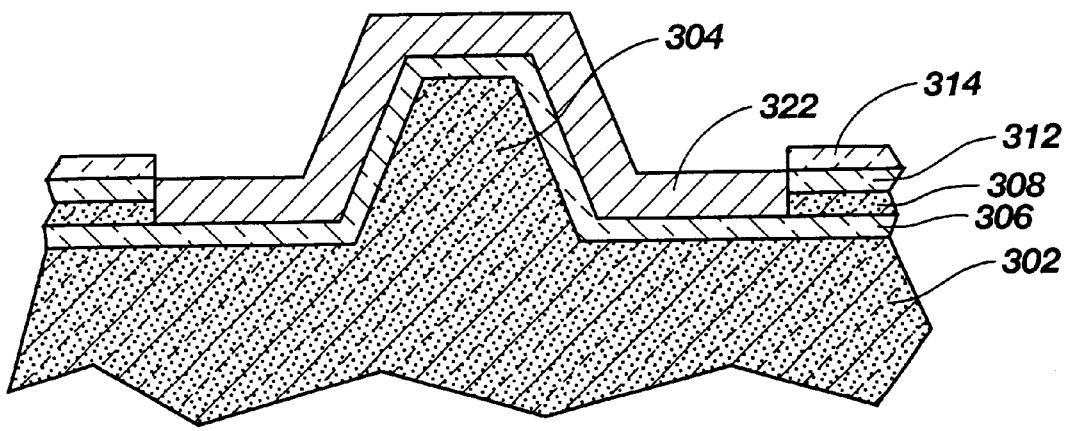

The non-reacted cobalt layer 318 is removed, preferably by a wet etch, such as hydrochloric acid/peroxide or sulfuric acid/peroxide mixtures, wherein the barrier material layer 314 preferably acts as an etch stop, as shown in FIG. 16. Preferably, the non-reacted cobalt layer 318 is etched in a dilute HPM (Hydrochloric acid/Peroxide Mixture) solution (typically, 1 volume of hydrochloric acid to 1 volume of peroxide to 5 volumes of water) for about 30 seconds at about 30° C.

Figure 17:
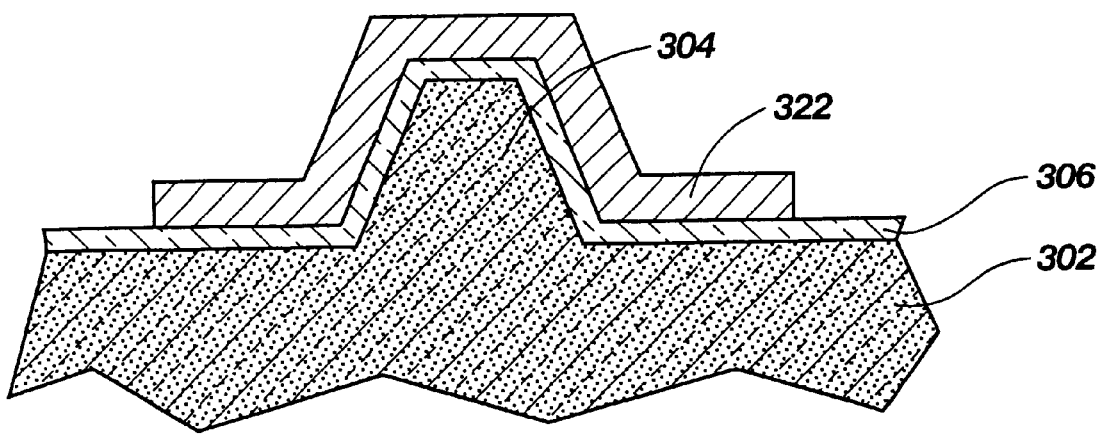

As shown in FIG. 17, the remaining barrier material layer 314 is then removed, preferably etching in an APM (Ammonia/Peroxide Mixture) solution (typically, 1 volume of ammonia to 1 volume of peroxide to 5 volumes of water) for between about 1 and 2 minutes at about 65° C., and the remaining second dielectric layer 312 and polysilicon layer 308 are also removed, by any known technique. The cobalt silicide layer 322 is not disturbed by the removal of the remaining barrier material layer 314 or the removal of the second dielectric layer 312 and polysilicon layer 308, as dry etches containing chlorine or fluorine will not etch cobalt silicide (i.e., $CoF_x$ and $CoCl_x$ are non-volatile).

Figure 18:
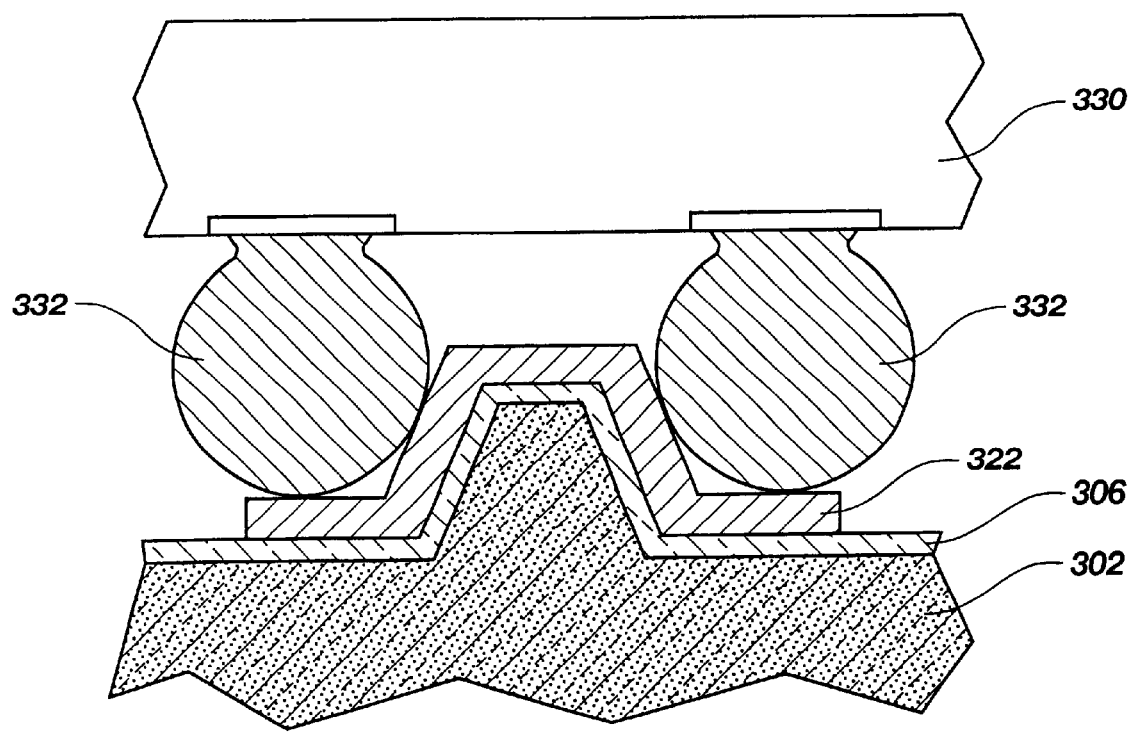
FIG. 18 is a cross-sectional view of a testing interface according to the present invention with a chip-under-test disposed therein.

Structures such as illustrated in FIG. 17 are generally used for testing of flip-chips, wherein, as illustrated in FIG. 18, solder bumps 332 of a flip-chip 330 electrically contact the cobalt silicide layer 322. The cobalt silicide layer 322 conducts electrical signals to and/or receives electrical signals from the flip-chip 330 through the solder bumps 332.

FIGS. 19–26 illustrate another method of forming a testing contact used in backend testing of semiconductor devices. Elements common between FIGS. 10-17 and FIGS. 19–26 retain the same numerical designation.

Figure 19:
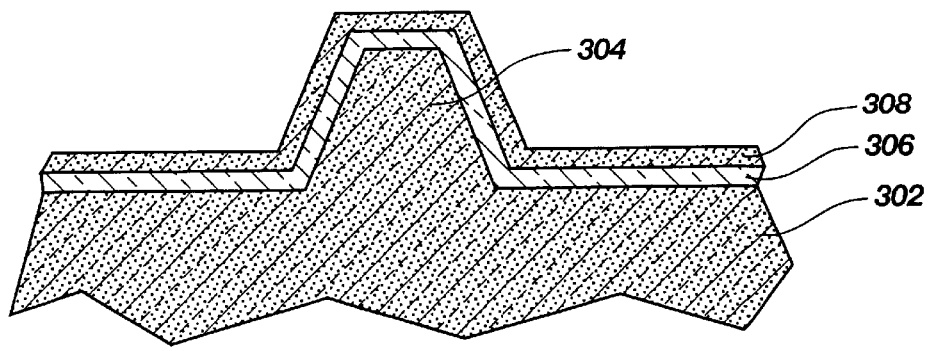
FIGS. 19–26 are cross-sectional views of another method of forming a testing interface according to the present invention.
Figure 20:
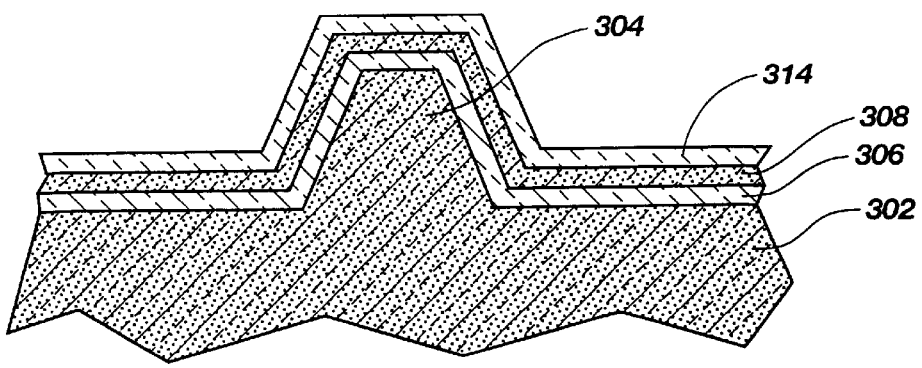

FIG. 19 illustrates a substrate 302 having at least one contact projection 304 disposed thereon, wherein the substrate 302 and the contact projection 304 have a first dielectric layer 306, preferably silicon dioxide, disposed thereover. A layer of polysilicon 308 is deposited by any known technique over the first dielectric layer 306. As shown in FIG. 20, a layer of barrier material 314, preferably titanium nitride, is deposited over the polysilicon layer 308.

Figure 21:
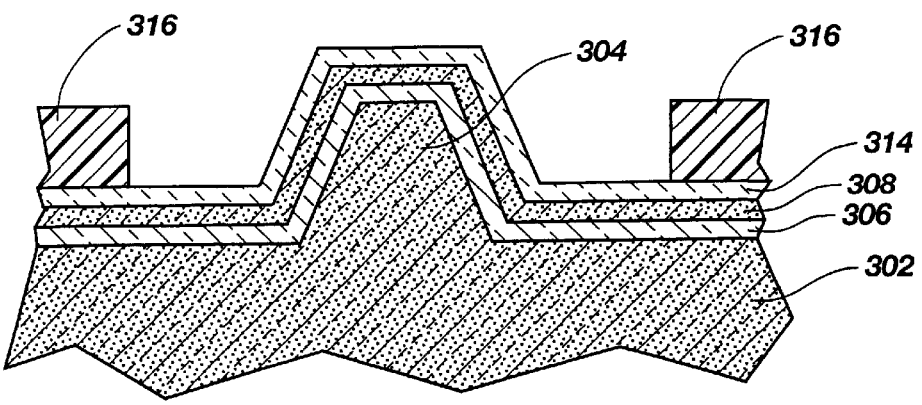
Figure 22:
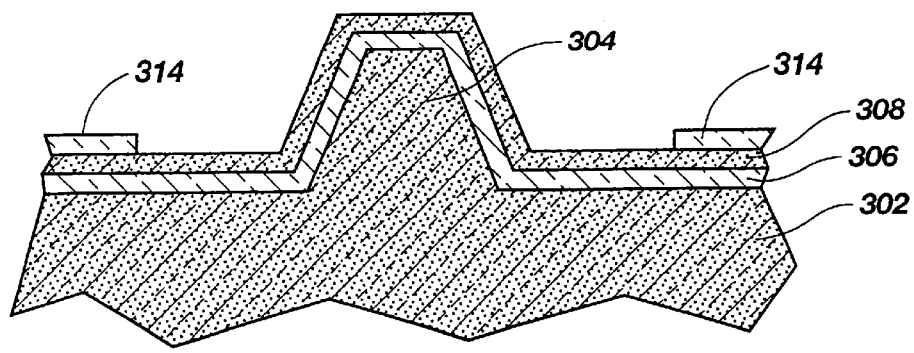
Figure 23:
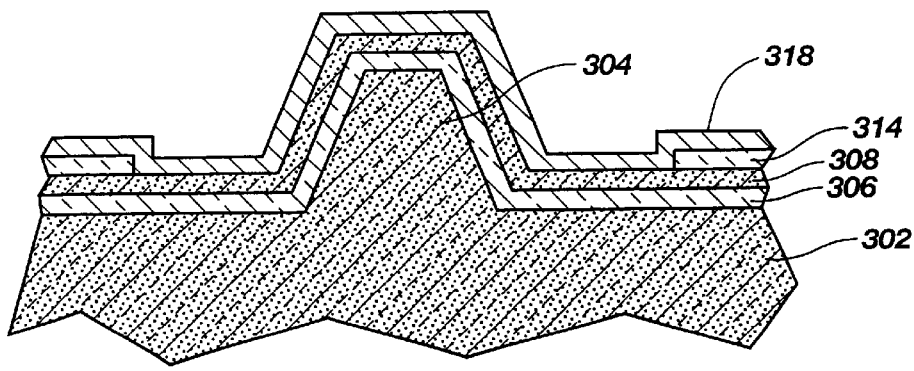
Figure 24:
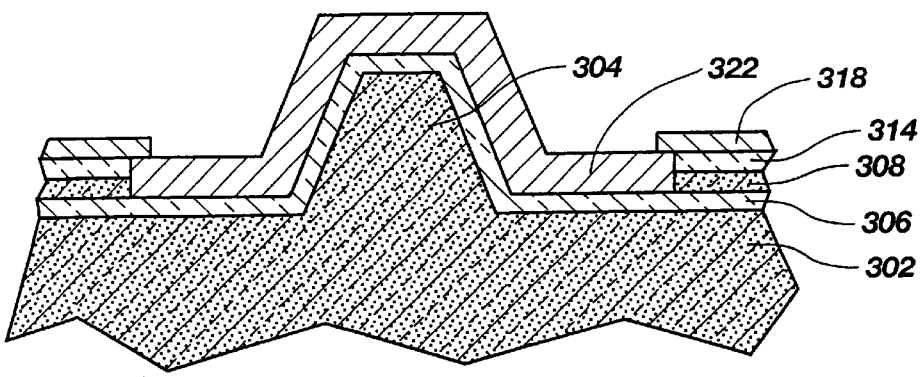

A mask material 316 is patterned on the barrier material layer 314, as shown in FIG. 21. The barrier material layer 314 is then etched to expose the polysilicon layer 308 over the contact projection 304, then any remaining mask material 316 is removed, as illustrated in FIG. 22. A thin layer of cobalt 318 is deposited over the barrier material layer 314 and onto the exposed contact projection 304, as shown in FIG. 23. A high temperature anneal step, preferably between about 400 and 800° C., most preferably between about 450 and 600° C. for between about 5 seconds and 1 hour, is conducted in an inert atmosphere, preferably nitrogen containing gas, to react the thin cobalt layer 318 with the exposed portion of the polysilicon layer 308 over the contact projection 304 which forms a cobalt silicide layer 322, as shown in FIG. 24.

Figure 25:
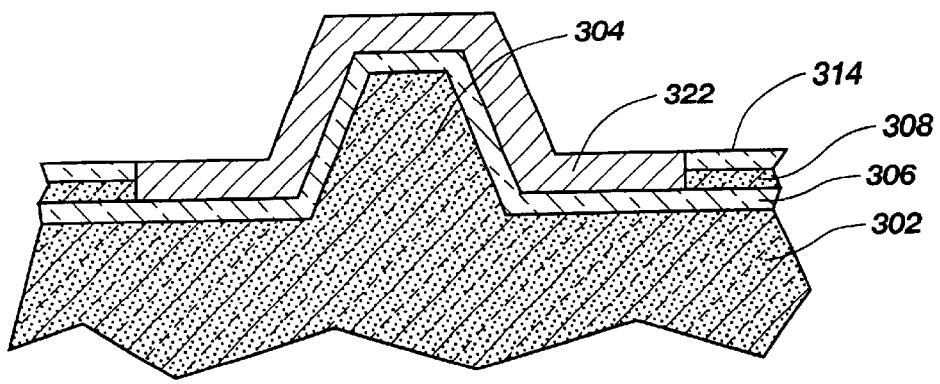
Figure 26:
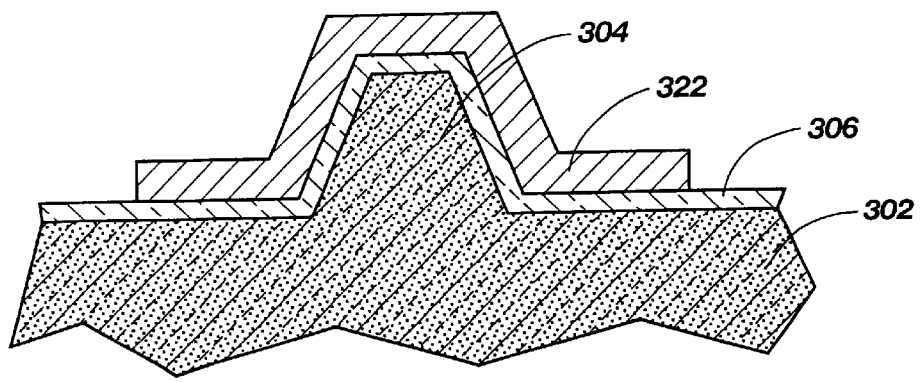
Figure 27:
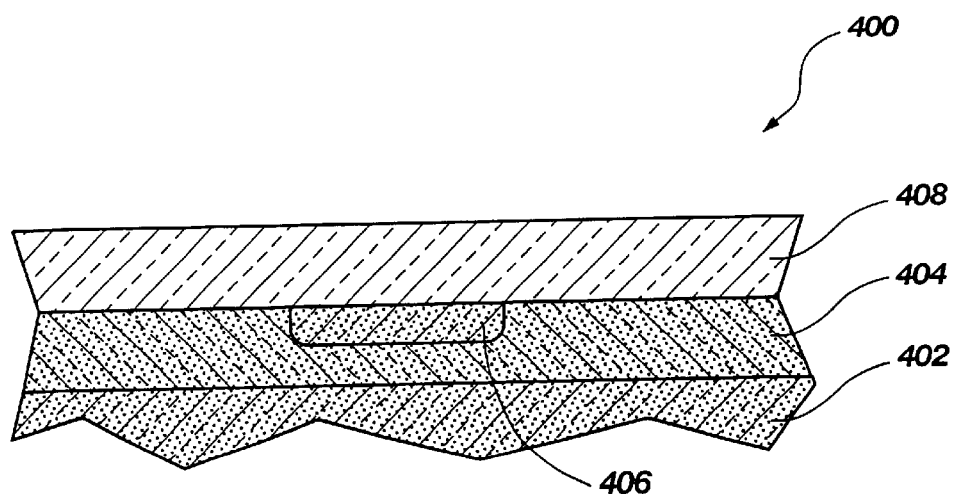
FIGS. 27–31 are cross-sectional views of a method of forming a contact interface in a thin semiconductor structure according to a known technique.
Figure 28:
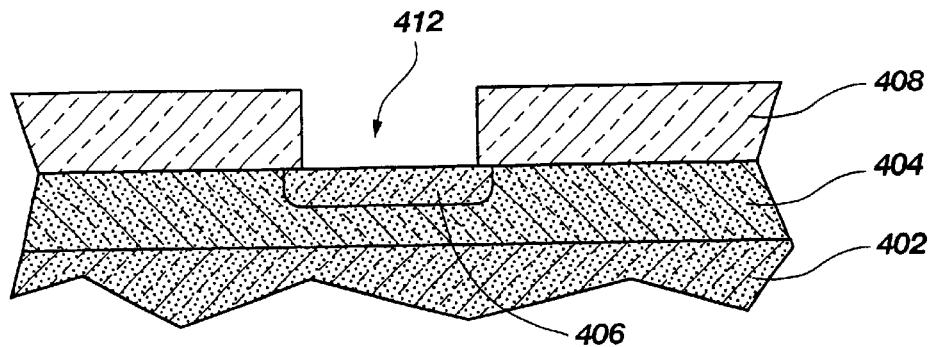
Figure 29:
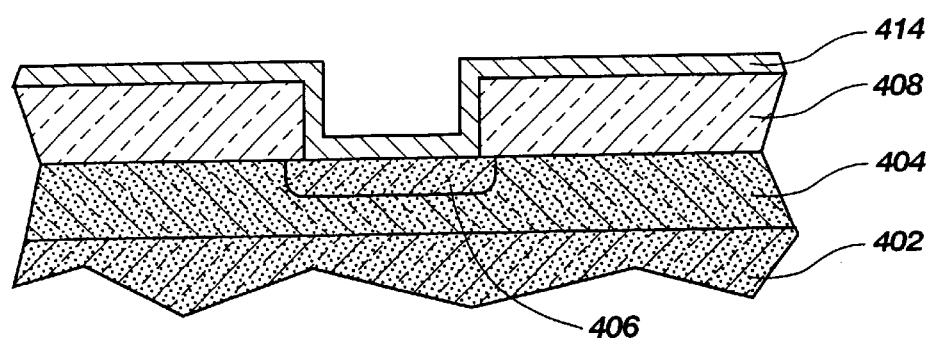
Figure 30:
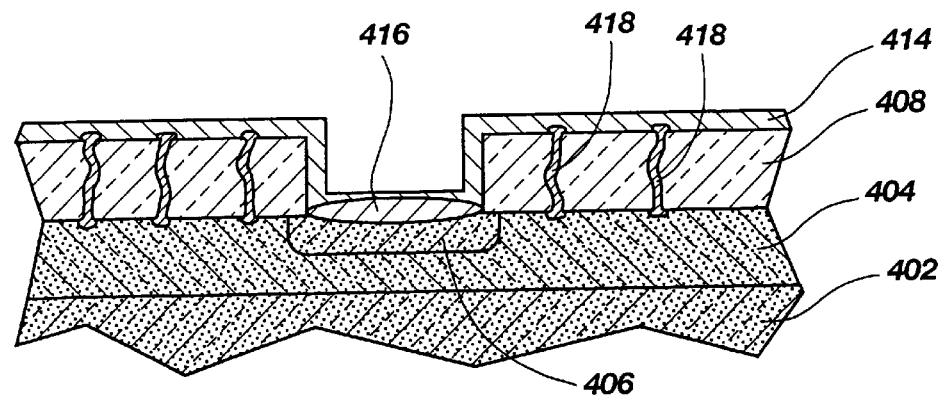
Figure 31:
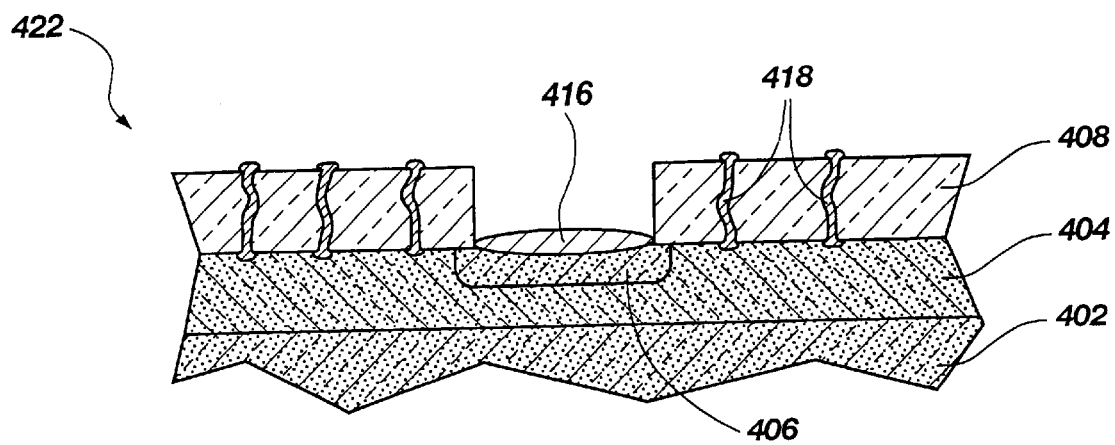
Figure 32:
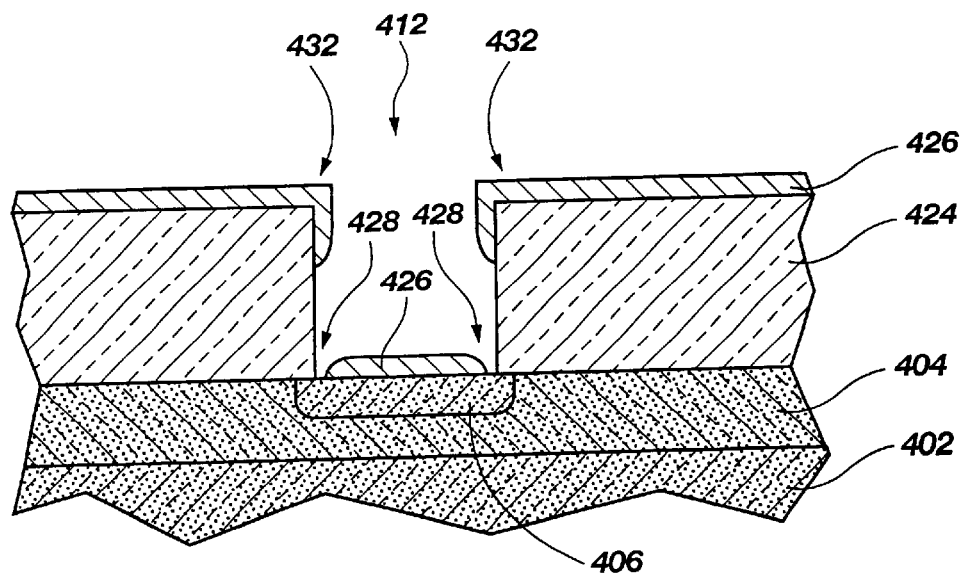
FIG. 32 is a cross-sectional view of the deposition of a metal layer in an opening in a thick dielectric according to a known technique.

The non-reacted cobalt layer 318 is removed, preferably by a wet etch, such as hydrochloric acid/peroxide or sulfuric acid/peroxide mixtures, wherein the barrier material layer 314 preferably acts as an etch stop, as shown in FIG. 25. As shown in FIG. 26, the remaining barrier material layer 314 and the remaining polysilicon 308 are removed.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method for forming a contact interface, comprising:
   providing a substrate comprising semiconductor material;
   forming a first layer comprising dielectric material over said semiconductor material;
   forming a second layer comprising barrier material over said first layer;
   exposing at least a portion of at least one active-device region formed in said semiconductor material through said first and second layers;
   disposing an electrically conductive silicidable material different from said barrier material into contact with at least said portion of said at least one active-device region;
   annealing said electrically conductive silicidable material to said at least one active-device region so as to form a silicide contact; and
   removing said second layer following said annealing.

2. The method of claim 1, wherein said forming said first layer comprises depositing TEOS.

3. The method of claim 1, wherein said forming said second layer comprises depositing titanium nitride.

4. The method of claim 1, wherein said disposing said electrically conductive silicidable material comprises disposing cobalt.

5. The method of claim 1, wherein said annealing is effected by heating at least said semiconductor material to a temperature of about 400° C. to about 800° C.

6. The method of claim 5, wherein said annealing is effected by heating at least said semiconductor material to a temperature of about 450° C. to about 600° C.

7. The method of claim 1, further including removing an unreacted portion of said electrically conductive silicidable material.

8. The method of claim 7, wherein said removing said unreacted portion is effected without substantially removing reacted electrically conductive silicidable material.

9. The method of claim 8, wherein said removing said unreacted portion is effected without substantially removing said barrier material.

10. The method of claim 7, wherein said removing said unreacted portion is effected with an HPM solution.

11. The method of claim 1, wherein said removing said second layer is effected without substantially removing reacted electrically conductive silicidable material.

12. The method of claim 11, wherein said removing said second layer is effected without substantially removing said first layer.

13. The method of claim 1, wherein said removing said second layer comprises substantially completely removing said second layer.

14. The method of claim 1, wherein said removing said second layer is effected with an APM solution.

15. The method of claim 1, wherein said forming said second layer comprises preventing said electrically conductive silicidable material from reacting with said semiconductor material through at least one of a void and an imperfection in said first layer.

16. The method of claim 1, wherein said forming said second layer comprises forming a layer comprising at least one of titanium nitride, tungsten nitride, tungsten silicon nitride, and titanium silicon nitride.

* * * * *

UNITED STATES PATENT AND TRADEMARK OFFICE
CERTIFICATE OF CORRECTION

PATENT NO. : 6,410,420 B2
DATED : June 25, 2002
INVENTOR(S) : Salman Akram and Y. Jeff Hu It is certified that error appears in the above-identified patent and that said Letters Patent is hereby corrected as shown below:

<u>Title page,</u>
Item [56], References Cited, U.S. PATENT DOCUMENTS, insert:
-- 5,981,380    11/1999        Trivedi et al. --

Signed and Sealed this

Thirtieth Day of March, 2004

JON W. DUDAS
*Acting Director of the United States Patent and Trademark Office*